United States Patent
McFarthing

(10) Patent No.: US 10,031,165 B2
(45) Date of Patent: Jul. 24, 2018

(54) WIRELESS CHARGING PERFORMANCE MEASUREMENT

(71) Applicant: QUALCOMM TECHNOLOGIES INTERNATIONAL, LTD., Cambridge (GB)

(72) Inventor: Anthony Lawrence McFarthing, Cambridgeshire (GB)

(73) Assignee: QUALCOMM Technologies International, LTD., Cambridge (GB)

( * ) Notice: Subject to any disclaimer, the term of this patent is extended or adjusted under 35 U.S.C. 154(b) by 818 days.

(21) Appl. No.: 14/138,480

(22) Filed: Dec. 23, 2013

(65) Prior Publication Data

US 2015/0177293 A1    Jun. 25, 2015

(51) Int. Cl.
*G01R 21/06* (2006.01)
*H02J 50/12* (2016.01)
(Continued)

(52) U.S. Cl.
CPC ............ *G01R 21/06* (2013.01); *G01R 25/00* (2013.01); *H02J 7/0021* (2013.01); *H02J 7/0047* (2013.01); *H02J 17/00* (2013.01); *H02J 50/12* (2016.02); *H02J 50/80* (2016.02); *H04B 5/00* (2013.01); *H04B 5/0037* (2013.01); *H04Q 9/00* (2013.01); *H04Q 2209/40* (2013.01)

(58) Field of Classification Search
CPC ........ G01R 21/00; G01R 21/06; G01R 25/00; G01R 25/005; H02J 17/00; H02J 7/025; H02J 50/80; H02J 50/12; H02J 7/0021; H02J 7/0047; H04B 5/0037; H04B 5/00; H04Q 9/00; H04Q 2209/40

See application file for complete search history.

(56) References Cited

U.S. PATENT DOCUMENTS 5,999,889 A * 12/1999 Tietsworth ............. G01R 29/10
                                                        375/347
8,134,410 B1 * 3/2012 Zortea .................... H03G 3/001
                                                        330/284
(Continued)

FOREIGN PATENT DOCUMENTS

DE    102011113336    3/2013
JP    2001238372      8/2001
(Continued)

OTHER PUBLICATIONS

Author: Saxena, Nitin, Title: "Electrical Engineering", Publisher: University Science Press, 2010.*
(Continued)

*Primary Examiner* — Hai Phan
*Assistant Examiner* — Franklin Balseca
(74) *Attorney, Agent, or Firm* — Procopio, Cory, Hargreaves & Savitch LLP

(57) ABSTRACT

Wireless charging methods, chargers and devices are disclosed, including a method of measuring wireless charging performance comprising transmitting a wireless charging signal, measuring a transmitted power of the wireless charging signal, receiving an indication of a received power from the wireless charging signal received by a device, and determining wireless charging performance based on the transmitted power and the indication of the received power.

18 Claims, 1 Drawing Sheet

(51) Int. Cl.
*H02J 50/80* (2016.01)
*G01R 25/00* (2006.01)
*H02J 7/00* (2006.01)
*H04Q 9/00* (2006.01)
*H04B 5/00* (2006.01)
*H02J 17/00* (2006.01)

(56) References Cited

U.S. PATENT DOCUMENTS

| | | |
|---|---|---|
| 2010/0259108 A1 | 10/2010 | Giler et al. |
| 2011/0196544 A1 | 8/2011 | Baarman et al. |
| 2012/0149307 A1* | 6/2012 | Terada .................... H02J 7/025 |
| | | 455/66.1 |
| 2012/0161532 A1 | 6/2012 | Ogawa et al. |
| 2012/0286726 A1* | 11/2012 | Kim ...................... B60L 11/182 |
| | | 320/108 |
| 2013/0099586 A1 | 4/2013 | Kato et al. |
| 2013/0154615 A1* | 6/2013 | Winoto ................ H03D 7/1441 |
| | | 324/123 C |

FOREIGN PATENT DOCUMENTS

| | | |
|---|---|---|
| JP | 2010051137 | 3/2010 |
| WO | 2013022722 A1 | 2/2013 |

OTHER PUBLICATIONS

British Search Report dated Jan. 29, 2015 in corresponding application GB1412783.1.
Examination Report issued in copending GB application No. GB1412783.1 dated Nov. 26, 2015 in 4 pages.

* cited by examiner

100

200

WIRELESS CHARGING PERFORMANCE MEASUREMENT

TECHNICAL FIELD

Embodiments of the invention described herein relate to wireless charging and in particular for example measurement of the performance of wireless charging.

BACKGROUND

Wireless charging of an electronic device is a desirable convenience as the requirement to physically connect the device to a wire, dock or other physical component while charging is removed.

Some devices are capable of communicating with each other according to the near-field communication (NFC Forum or ISO14443) standard or radio frequency identification (RFID) standard. According to these standards, one device (a reader) can communicate with another device (a tag). The tag may also harvest power from a signal transmitted by the reader, so that the tag may not require any other power source. The tag device has an antenna that is resonant at a frequency on which NFC (or RFID) communications are transmitted from the reader in order to be able to receive as much energy as possible from the signal. This allows the tag to extract as much energy as possible for powering the device as well as ensuring communication reliability.

SUMMARY OF EMBODIMENTS OF THE INVENTION

According to a first aspect of embodiments of the invention, there is provided a method of measuring wireless charging performance comprising transmitting a wireless charging signal, measuring a transmitted power of the wireless charging signal, receiving an indication of a received power from the wireless charging signal received by a device, and determining wireless charging performance based on the transmitted power and the indication of the received power.

According to a second aspect of embodiments of the invention, there is provided a wireless charging method comprising receiving a wireless charging signal from a wireless charger, measuring a received power of the wireless charging signal, and transmitting an indication of the received power to the wireless charger.

According to a third aspect of embodiments of the invention, there is provided a wireless charger comprising an antenna, a transmitter for transmitting a wireless charging signal using the antenna, measurement apparatus for measuring a transmitted power of the wireless charging signal, a receiver for receiving an indication of a received power from the wireless charging signal, and processing apparatus for determining wireless charging performance based on the transmitted power and the indication of the received power.

According to a first aspect of embodiments of the invention, there is provided a wireless communications device comprising a receiver for receiving a wireless charging signal from a wireless charger, measuring apparatus for measuring a received power of the wireless charging signal, and a transmitter for transmitting an indication of the received power to the wireless charger.

BRIEF DESCRIPTION OF THE FIGURES

Embodiments of the invention will now be described by way of example only, in which.

DETAILED DESCRIPTION OF EMBODIMENTS OF THE INVENTION

Figure 1:
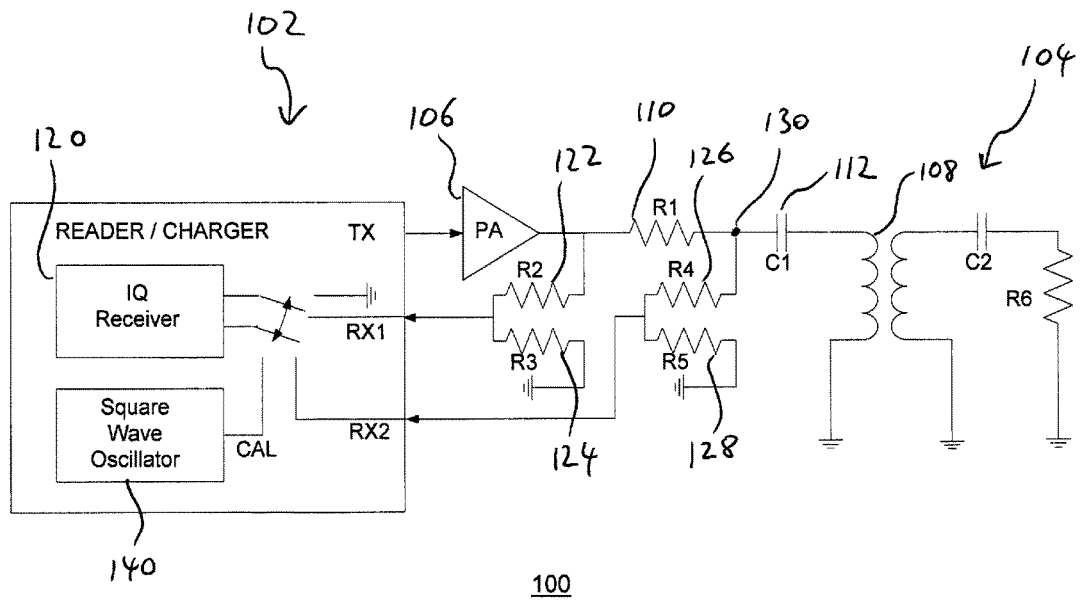
FIG. 1 shows a wireless charging system according to an embodiment of the invention.

Some NFC or RFID capable devices may be associated with a battery. The battery may be present for example to power the device when not enough power is being extracted from a signal transmitted from a reader (or other NFC or RFID device), or when no such signal is being transmitted. Additionally or alternatively, for example, the NFC or RFID device may be associated with another device such as a mobile telephone that is typically powered by a battery. The device is thus NFC or RFID capable.

Specific embodiments described below relate to NFC although the principles disclosed herein may also be applied to other wireless charging and communication technologies (for example, RFID).

NFC Wireless Charging (NFC WC) could be used to charge NFC or RFID capable devices that also include a battery. An NFC charging device, which in some cases may also be an NFC reader, may transmit a wireless charging signal on a frequency typically used for NFC communications, such as 13.56 or 6.78 MHz. A wireless charging signal is a signal with a power higher than that typically expected from a reader device when powering tags for communication purposes and not for charging a battery. An example of the power of a wireless charging signal is 10 W although other power levels are possible whereas a reader might only transfer powers less than 100 mW.

The power transferred between a wireless charger antenna and an antenna on a device being charged is dependent on a number of factors that affect the proportion of power transferred from the charger to the device. For example, the factors may include one or more of relative position of the charger and the device being charged, the antenna coupling factor between the charger and device, the presence of other devices being charged, the presence of other parasitic devices, and other factors.

Embodiments of the invention determine the power being transmitted by the wireless charger and the power being received by one or more devices, and determine wireless charging performance based on the transmitted and received power. The performance may be, for example, the proportion of the power transmitted signal that is being received by the one or more devices, the difference between the transmitted and received power, or some other measure. If the performance falls below a certain level, some embodiments may stop transmission of the wireless charging signal. This may be for example to protect parasitic devices, such as NFC or RFID tags, that could be damaged by the wireless charging signal. Additionally or alternatively, for example, transmission may be stopped to keep the wireless charging efficiency above a certain level.

In some embodiments, the wireless charger may transmit a wireless charging signal to multiple receiving devices. In such a case, embodiments of the invention determine wireless charging performance based on the transmitted power and the sum of received powers received at each of the devices.

Embodiments of the invention may then be able to use the wireless charging performance (for example, the difference between the transmitted real power and the received real power in one or multiple devices) to ensure that real power is not absorbed in an unintentional target device that may not be able to dissipate the power safely. When the difference between transmitted and total received power is significant then power transfer can be terminated.

FIG. 1 shows an example of a wireless charging system 100 in accordance with embodiments of the invention. The system 100 includes a NFC wireless charger 102, which can transmit a wireless charging signal at the NFC frequency 13.56 MHz, and a device being charged 104 such as a NFC tag. Other frequencies are also possible including, for example, the frequency used by A4WP, 6.78 MHz. The charger 102 includes a transmitter that provides a signal to be transmitted to a power amplifier 106. The signal to be transmitted may be a wireless charging signal for transferring power from the charger 102 to the device 104 (and possibly additional devices). In some embodiments, or at certain times, the wireless charging signal may be modulated (for example, amplitude modulated) by an information signal by the transmitter.

The output from the power amplifier 106 is provided to an antenna 108 via a series connected resistor 110 and matching capacitor 112. The antenna 108 is shown connected between the capacitor 112 and ground, though in some alternative embodiments a balanced power amplifier might be used, in which case this circuit would then become the balanced equivalent. In this type of design the ground connection of the antenna 108 would instead be connected to a second driven point of the power amplifier.

The charger 102 also includes an IQ receiver 120. The IQ receiver 120 includes two inputs. A first input is selectively connected to either ground or a node RX1, and a second input is selectively connected to either the node RX1 or a node RX2.

The node RX1 is connected to the mid point of a potential divider comprising resistors 122 and 124 that are connected in series between the output of the power amplifier 106 and ground. The node RX2 is connected to the mid point of a potential divider comprising resistors 126 and 128 connected in series between a node 130 and ground. The node 130 is between the resistor 110 and the capacitor 112.

In some embodiments, the IQ receiver 120 and/or processing apparatus (not shown) may monitor the signal being output from the power amplifier 106 and provided to the antenna 108. For example, characteristics of the signal may be monitored, such as the voltage and current of the signal, and their relative phase.

In some embodiments, the IQ receiver 120 monitors the current as follows. The first input of the IQ receiver is connected to the node RX1 and the second input is connected to the node RX2. The potential divider formed by resistors 122 and 124 provides a voltage at RX1 that is proportional to the power amplifier 106 output voltage. The potential divider formed by resistors 126 and 128 provides a voltage at RX2 that is proportional to the voltage at the node 130. The difference between these two voltages represents (for example, is proportional to) the voltage across the resistor 110, and thus is proportional to the current flowing through the resistor 110, and the current in the antenna 130. The phase of this current signal can be measured by the IQ receiver 120 in a conventional manner with respect to the phase of the IQ receiver's synchronous local oscillator, LO, (not shown).

In some embodiments, the IQ receiver 120 measures the voltage as follows. The first input of the IQ receiver 120 is connected to ground and the second input is connected to the node RX1. Thus, the voltage at the node RX1 and the first input of the IQ receiver 120 is substantially proportional to the voltage being provided to the antenna 108. In some embodiments, the resistor 110 is a "low value" resistor, such that little power is dissipated by the resistor. In one example embodiment, where the power amplifier 106 provides a signal of 10 W power, the peak voltage from the power amplifier may be 31V. The input to the receiver (for example, the first or second input) may be required to be 1V or less, for example, where the IQ receiver (and optionally other components of the charger 102) are implemented on an integrated circuit (IC). Thus, the resistor 110 may be chosen to be around 1 ohm, and the resistors 122 and 126 may be 5 kohm. The potential dividers may be arranged to drop the voltages around the resistor 110 by a factor of around 1:30, for example.

The IQ receiver 120 can then measure the phase of the voltage of the signal in a conventional manner as before with respect to the phase of the IQ receiver's synchronous LO.

Thus, the charger 102 has information representing the magnitudes and phases of the voltage and current of the signal being provided to the antenna. From this, in some embodiments the charger 102 can determine the power being output from the power amplifier 106 and thus the power being transferred in the wireless charging signal being transmitted by the charger 102 (minus any losses in other components of the charger 102, such losses are preferably as small as possible).

The gain of the IQ receiver 120 may in some embodiments not be known accurately. Therefore, in some embodiments the IQ receiver 120 may be used in a calibration mode whereby (for example) the first input is connected to ground and the second input is connected to a square wave oscillator 140. The square wave oscillator provides a square wave that oscillates between ground and an accurate voltage level, for example, whereby the accurate voltage level may be provided by a bandgap circuit. This calibration mode can be used to remove IQ receiver gain uncertainty and allow the magnitudes of the voltage and current of the power amplifier 106 output signal to be accurately measured.

In some embodiments, the IQ receiver 120 measures the current followed by the voltage of the power amplifier 106 output signal, though in other embodiments these steps may be performed in either order. In other embodiments, however, the current and voltage and their phases may be measured in other ways. For example, the charger may include multiple IQ receivers, one to measure the voltage and one to measure the current for example, and in such embodiments the input switching arrangement may not be necessary. Other ways of measuring the current and voltage or other signal characteristics or the impedance of the load are also envisaged and this disclosure is not limited to any particular manner of measurement.

After due account is taken of the potential divider attenuation, the current (I) and voltage (V) of the power amplifier (PA) output signal can be determined. The phase angle (alpha) between the voltage and current signals can also be determined using the phase of the LO as a common reference in both measurements of I and V, and so the real transmitted power from the PA can be determined as (V*I*cos(alpha)). It might be possible to calculate the complex power without due regard for relative angles but the lost power algorithm depends on the basic physics law of the conservation of energy, all dissipated and transmitted real power (or energy) must be accountable in any system. When the transmitted real power does not equal the received real power then the difference will be being dissipated elsewhere and possibly and unwantedly in a third party device.

Alternatively, as the output signal frequency and the LO frequency will in some implementations have a related phase relationship (they may even have the same frequency and be totally phase synchronous), the receiver could calculate the transmit real power in a slightly different way. The output impedance seen by the PA could be calculated as the ratio of V/I as a complex quantity in the IQ receiver. From this the real part of the output impedance could then be calculated (R). Then simply from determining either the magnitude of the previously measured current (I) or the measured voltage (V) the real transmit power could be calculated as either (($V^2$)/R) or as (($I^2$)*R).

Once the real transmitted power is known, the charger 102 may determine wireless charging performance based on the transmitted power and an indication of the received power received by the device 104 being charged by the wireless charging signal. An indication of the received power may be transmitted to the charger 102 by the device 104. For example, the device 104 may load modulate the wireless charging signal in a manner that is detectable by the wireless charger 102 (for example, by the IQ receiver 120) and in a manner that is similar to load modulation of a signal from a reader by a conventional NFC tag, and thus transmit the indication to the charger 102. The indication comprises information that allows the real received power to be determined, and may comprise a value for the real received power for example.

The device 104 may include circuitry similar to that included in the charger 102 to measure the real received power as an RF signal rather than at DC. In alternative embodiments, however, the device will rectify the received signal to provide a DC output voltage and current (for example, for charging a battery and/or providing operating power to the device 104). These DC voltage and current levels could be used to determine the received power. In some embodiments, where the efficiency level of converting received RF power to DC power is known, this information can be used when determining the received power from the DC voltage and current levels. That is, the actual received power may be higher than the value determined from the voltage and current levels and an indication of the actual received power (calculated by, for example, dividing the detected power by an efficiency value that is less than 1) can be communicated back to the charger 102.

The device 104 may provide the indication to the charger 102 periodically, in response to a poll or instruction from the charger 102, or in any other suitable manner.

The transmitted power and received power may be compared by the charger 102 (for example, by processing apparatus) and the wireless performance determined. If there are multiple devices being charged, the received power may be a sum of the power received by each of those devices. If wireless performance is below a certain level, then the charger 102 (for example, the processing apparatus) may control the power amplifier 106 or the transmitter to stop transmitting the wireless charging signal. Transmission may resume after a predetermined period, or in response to some other stimulus.

Figure 2:
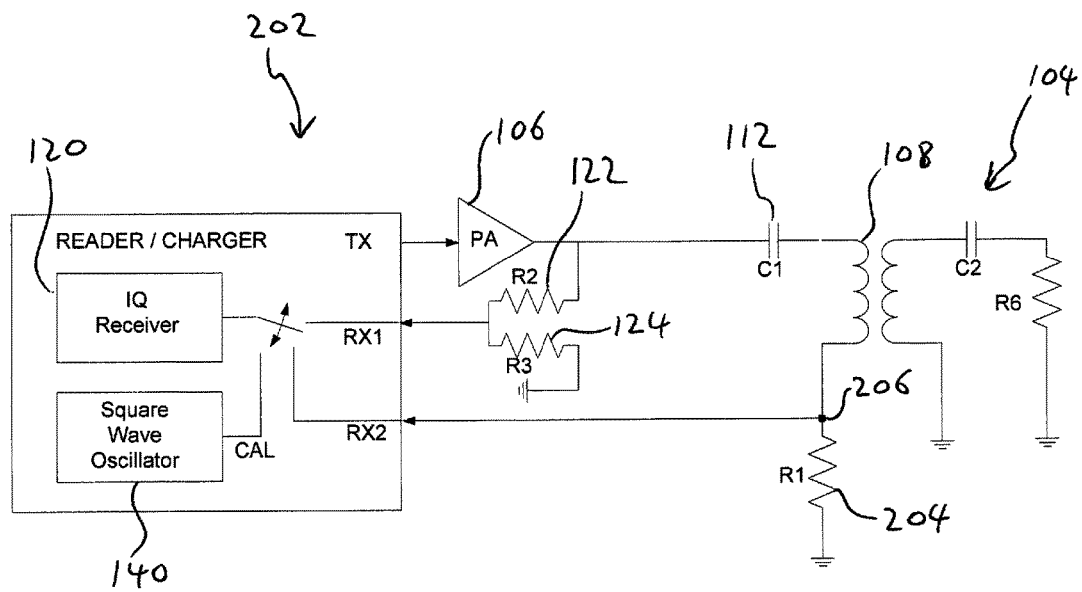
FIG. 2 shows a wireless charging system according to another embodiment.

FIG. 2 shows an alternative wireless charging system 200 that includes a wireless charger 202 charging a device 104. Some components of the charger 202 are similar to those of the charger 102 shown in FIG. 1 and are thus given like reference numerals. In the charger 102, the power amplifier 106 provides a signal to the antenna 108 via the matching capacitor 112. A potential divider comprising resistors 122 and 124 connected between the power amplifier 106 output and ground provide an indication of the power amplifier output voltage to a node RX1. A resistor 204 is connected between the antenna 108 and ground. A node 206 between the antenna 108 and the resistor 204 is connected to a node RX2.

In some embodiments, the IQ receiver 120 may be identical to that shown in FIG. 1, with one of its inputs permanently connected to ground for example, though in other embodiments, a different IQ receiver could be used.

In operation, a first input of the IQ receiver 120 is connected to the node RX1 to measure the power amplifier 106 output voltage and the phase thereof as before. The first input 120 of the IQ receiver 120 is then connected to the node RX2 to measure the signal current (though this can be done before the voltage is measured instead) by measuring the voltage across the resistor 204. Only a single connection is required as the resistor is connected at one end to ground. In the embodiment shown in FIG. 2, the IQ receiver may have only a single input.

The input of the IQ receiver may also in some embodiments be connected to the output of a square wave oscillator 140.

The capacitor 112 shown in FIG. 112 may instead be a resistive or inductive component or may be a more complex network including capacitive, inductive and/or resistive components. In some embodiments, the network may be adjustable.

Although the embodiment of FIG. 2 is described as calculating the real transmitted power based on the current, voltage and their relative phases of the power amplifier 106 output signal, the power can be determined in other ways, for example as indicated above with respect to FIG. 1.

Although methods, devices and electronic components have been disclosed in the context of certain preferred embodiments and examples, it will be understood by those skilled in the art that this disclosure extends beyond the specifically disclosed embodiments to other alternative embodiments and/or uses and obvious modifications and equivalents thereof. In addition, while several variations have been shown and described in detail, other modifications, which are within the scope of this disclosure, will be readily apparent to those of skill in the art. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the disclosed embodiments. Thus, it is intended that the scope of the present invention herein disclosed should not be limited by the particular disclosed embodiments described above, but should be determined only by a fair reading of the claims that follow.

What is claimed is:

1. A method of measuring wireless charging performance comprising:
    providing an oscillation signal to a power measurement apparatus, the oscillation signal comprising a wave that oscillates between a known first voltage level and a known second voltage level;
    setting a receiver gain of the measurement apparatus based on measured voltage levels produced in response to receiving the oscillation signal wave at the known first and second voltage levels;
    transmitting a wireless charging signal;
    subsequent to setting the receiver gain, measuring a transmitted power of the wireless charging signal by measuring voltage and current of a signal provided to an antenna for transmitting the wireless charging signal, measuring a relative phase of the voltage and the current, and calculating the transmitted power based on the voltage, the current and the relative phase;

receiving an indication of a received power from the wireless charging signal received by a device; and determining wireless charging performance based on the measured transmitted power and the indication of the received power;

wherein measuring the voltage of the signal provided to the antenna for transmitting the wireless charging signal comprises:

connecting a first input of the measurement apparatus to a ground; and connecting a second input of the measurement apparatus to a first potential divider that is connected to a first node at an output of a power amplifier producing the signal provided to the antenna.

2. The method of claim 1, wherein the indication of the received power is received from the device.

3. The method of claim 1, wherein determining the wireless charging performance comprises comparing the transmitted power and the indication of the received power.

4. The method of claim 1, wherein determining the wireless charging performance comprises determining at least one of a difference between the transmitted power and the received power and a ratio of the received power to the transmitted power.

5. The method of claim 4, further comprising stopping transmission of the wireless charging signal when the difference reaches or is greater than a predetermined threshold, or the ratio reaches or falls below a predetermined threshold.

6. The method of claim 1, further comprising stopping transmission of the wireless charging signal when the wireless charging performance is less than a predetermined level.

7. The method of claim 1, further comprising receiving one or more further indications of received power from the wireless charging signal received by each of one or more further devices, and wherein determining the wireless charging performance comprises determining the performance based on the transmitted power, the indication of the received power and the one or more further indications of received power.

8. The method of claim 1, wherein measuring the current of the signal provided to the antenna for transmitting the wireless charging signal comprises:

connecting one of the first and second inputs of the measurement apparatus to the first potential divider, where the first node is between the power amplifier and a resistance in series between the power amplifier and the antenna; and connecting another one of the first and second inputs of the measurement apparatus to a second potential divider that is connected to a second node between the resistance and the antenna.

9. The wireless charger of claim 1, wherein the oscillation signal is a square wave and the first known voltage level is a ground voltage level.

10. A wireless charger comprising:
an antenna;
a transmitter for transmitting a wireless charging signal using the antenna;
an oscillator for providing an oscillation signal, the oscillation signal comprising a wave that oscillates between a known first voltage level and a known second voltage level;
measurement apparatus for measuring a transmitted power of the wireless charging signal, wherein, when performing a calibration procedure, the measurement apparatus is configured to receive the oscillation signal from the oscillator and set a receiver gain of the measurement apparatus based on measured voltage levels produced in response to receiving the oscillation signal wave at the known first and second voltage levels;
a receiver for receiving an indication of a received power from the wireless charging signal;
processing apparatus for determining wireless charging performance based on the measured transmitted power and the indication of the received power;
a power amplifier for producing the signal provided to the antenna; and
a first potential divider that is connected to a first node at an output of the power amplifier,
wherein, subsequent to setting the receiver gain, the measurement apparatus is configured to measure voltage and current of a signal provided to the antenna for transmitting the wireless charging signal, measure a relative phase of the voltage and the current, and calculate the transmitted power based on the voltage, the current and the relative phase; and
wherein the measurement apparatus comprises a first input and a second input and, when measuring the voltage of the signal provided to the antenna for transmitting the wireless charging signal, the measurement apparatus is configured to:
connect the first input of the measurement apparatus to a ground; and
connect a second input of the measurement apparatus to the first potential divider.

11. The wireless charger of claim 10, wherein the receiver is arranged to receive the indication of the received power from the device.

12. The wireless charger of claim 10, wherein the processing apparatus is arranged to determine the wireless charging performance by comparing the transmitted power and the indication of the received power.

13. The wireless charger of claim 10, wherein the processing apparatus is arranged to determine the wireless charging performance by determining at least one of a difference between the transmitted power and the received power and a ratio of the received power to the transmitted power.

14. The wireless charger of claim 13, wherein the processing apparatus is arranged to stop the transmitter from transmitting the wireless charging signal when the difference reaches or is greater than a predetermined threshold, or the ratio reaches or falls below a predetermined threshold.

15. The wireless charger of claim 10, wherein the processing apparatus is arranged to stop the transmitter from transmitting the wireless charging signal when the wireless charging performance is less than a predetermined level.

16. The wireless charger of claim 10, wherein the receiver is configured to receive one or more further indications of received power from the wireless charging signal received by each of one or more further devices, and wherein the processing apparatus is arranged to determine the wireless charging performance by determining the performance based on the transmitted power, the indication of the received power and the one or more further indications of received power.

17. The wireless charger of claim 10, further comprising:
a resistance in series between the power amplifier and the antenna;
a second potential divider that is connected to a second node between the resistance and the antenna;
wherein, when measuring the current of the signal provided to the antenna for transmitting the wireless charging signal, the measurement apparatus is configured to:
connect one of the first and second inputs of the measurement apparatus to the first potential divider, where the first node is between the power amplifier and the resistance, and
connect another one of the first and second inputs of the measurement apparatus to the second potential divider.

18. The wireless charger of claim 10, wherein the oscillation signal is a square wave and the first known voltage level is a ground voltage level.

\* \* \* \* \*